United States Patent [19]

Park

[11] Patent Number: 5,753,554
[45] Date of Patent: May 19, 1998

[54] SEMICONDUCTOR DEVICE AND METHOD OF FORMING THE SAME

[75] Inventor: Sang-Hoon Park, Ich'on, Rep. of Korea

[73] Assignee: Hyundai Electronics Industries Co., Ltd., Ich'on, Rep. of Korea

[21] Appl. No.: 774,214

[22] Filed: Dec. 27, 1996

[30] Foreign Application Priority Data

Dec. 30, 1995 [KR] Rep. of Korea ............... 1995-69468

[51] Int. Cl.$^6$ ........................................ H01L 21/336
[52] U.S. Cl. .................. 438/296; 438/259; 438/270; 438/430; 438/589
[58] Field of Search .......................... 438/259, 270, 438/271, 272, 296, 430, 589, 180, 197

[56] References Cited

U.S. PATENT DOCUMENTS

| | | |
|---|---|---|
| 4,536,782 | 8/1985 | Brown . |
| 4,830,975 | 5/1989 | Bovaird et al. ............... 438/589 |
| 5,093,273 | 3/1992 | Okumura ..................... 438/589 |
| 5,316,959 | 5/1994 | Kwan et al. .................. 438/270 |

FOREIGN PATENT DOCUMENTS 287064  11/1988  Japan ............................ 438/180

*Primary Examiner*—Trung Dang
*Attorney, Agent, or Firm*—Ware, Fressola, Van Der Sluys & Adolphson LLP

[57] ABSTRACT

A semiconductor device and method of forming the same are disclosed for eliminating the surface topology can be properly eliminated. A selected regions of semiconductor substrate for forming a gate and field oxide layer are etched to form trenches, a field oxide layer is formed in the inner part of trench which is corresponding to a selected region of field oxide layer and then a gate oxide film on surface of the semiconductor substrate and the inner part of the trenches. A gate is filled with a gate material in the trenches to a gate, junction regions are then formed in the semiconductor substrate which corresponds to either side of the gate.

15 Claims, 4 Drawing Sheets

SEMICONDUCTOR DEVICE AND METHOD OF FORMING THE SAME

FIELD OF THE INVENTION

This invention relates to a semiconductor device and a method of forming the semiconductor device. More particularly, this invention relates to a semiconductor device having a planar surface and a method for forming the same.

BACKGROUND OF THE INVENTION

Generally, conventional semiconductor devices, are formed as follows.

As shown in FIG. 1A, a field oxide layer 2 is typically formed on a selected region of a silicon semiconductor substrate 1 by a local oxidation silicon(LOCOS) technique thereby defining an active region 100. Next, a gate oxide film 3 at a thickness of approximately 100–200 Angstroms is formed on the silicon substrate 1 by a thermal oxidation technique. Next, a polysilicon layer 4 is deposited on the gate oxide film 3 by a chemical vapor deposition(CVD) method.

Referring to FIG. 1B, polysilicon layer 4 is etched such that the patterned polysilicon layer 4 is arranged at a center portion of the active region 100 to form a gate 4A. Using the gate 4A as the mask, a low concentration impurity ions are implanted into the exposed silicon substrate 1 thereby forming a low concentration impurity layer 5 to either side of the gate 4a. An oxide film 6 is then deposited by a conventional CVD method. Thereafter, as shown FIG. 1C, the oxide film 6 is anisotropically etched such that the oxide film 6 remains at vertical boundaries of gate 4A, to form sidewall spacers 7. Using the sidewall spacers 7 and gate 4A as the mask, a high concentration impurity ions are implanted into the exposed silicon substrate 1 thereby forming a high concentration impurity layer 8. At that point, the impurity layers 5 and 8 are made into junction regions, and the semiconductor device is thus formed.

According to the above-mentioned conventional art, however the semiconductor device has severe topological irregularities in the height of the field oxide layer 2, gate 4A and field transistor which is formed on the field oxide layer 2. Consequently, following the formation of the metal line, shorts may occur between a metal line and a metal line adjacent thereto due to the severe topological irregularities.

In addition, as the area of semiconductor device is reduced, hot carriers are generated due to a high electric field formed at the edge portions of gate 4A. In the case that the generated hot carriers are trapped in the gate oxide film 3, defects are generated in the gate oxide film 3 thereby deteriorating the operation and shortening the life of the semiconductor device.

SUMMARY OF THE INVENTION

It is an object of the present invention to provide a semiconductor device and a method of forming the same capable of eliminating the surface topology of the gate and field oxide layer.

Another object of the present invention is to provide a semiconductor device and a method of forming the same capable of preventing shorting between the metal lines due to the severe topological irregularities.

A further object of the present invention is to provide a semiconductor device and method of forming the same capable of preventing the hot carrier effect of the semiconductor device.

In accordance with these and other objects, there is provided a semiconductor device comprising: a plurality of trenches formed in a semiconductor substrate, having a selected depth; a field oxide film formed in any one of the trenches at a selected thickness; a gate insulating film formed on the surface of the semiconductor substrate and inner wall of any one of the other trenches; a plurality of gate electrodes filled in all of trenches, wherein the surface of the gate electrodes is positioned at the same plane with that of the semiconductor substrate; and a plurality of junction regions formed in the semiconductor substrate between the trenches.

In accordance with the present invention, there is provided a method of forming semiconductor device comprises the step of: etching selected regions of semiconductor substrate to form a plurality of trenches; forming a field oxide layer in the inner wall of trench which is corresponding to selected region of field oxide layer among said trenches; filling said trenches with a conductive material to form a gate electrode; and forming junction region in the semiconductor substrate between the trenches.

BRIEF DESCRIPTION OF THE DRAWING

The preferred embodiment of the present invention will now be described more specifically with reference to the following description, appended claims, and the attached drawing wherein:

DESCRIPTION OF THE PREFERRED EMBODIMENT

Figure 1A:
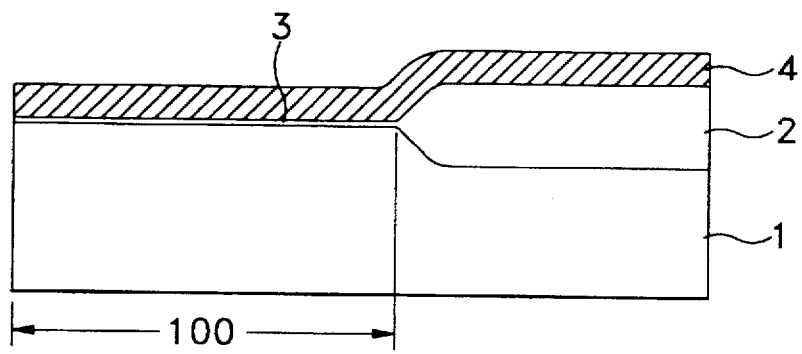
FIGS. 1A to 1C are sectional views for explaining step for forming a conventional semiconductor device.
Figure 1B:
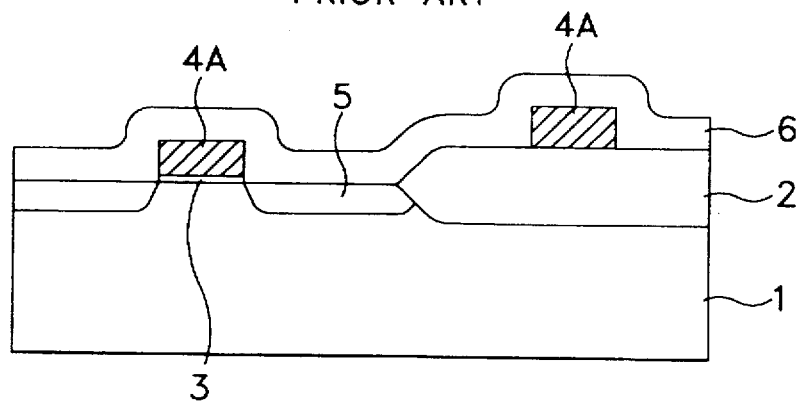
Figure 1C:
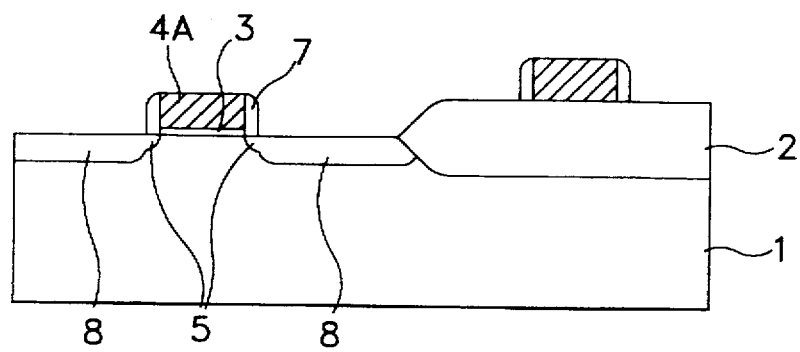
Figure 2A:
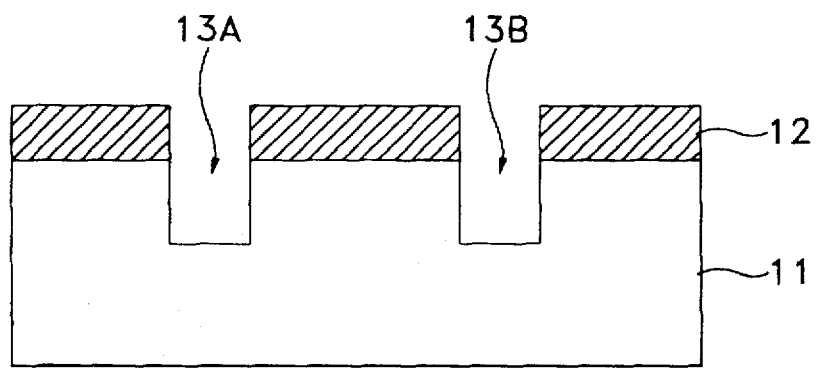
FIGS. 2A to 2H are sectional views for explaining step for forming a semiconductor device according to the present invention.

As shown in FIG. 2A, a first resist pattern 12 is formed on a P-type semiconductor substrate 11 by conventional photolithography technique wherein selected regions are exposed for forming a gate and a field oxide layer. Using the first resist pattern 12, and the exposed semiconductor substrate 11 is then anisotropically etched by reactive ion etching(RIE) technique to form trenches 13A and 13B having depth in the range of 5000–12000 Angstroms.

Figure 2B:
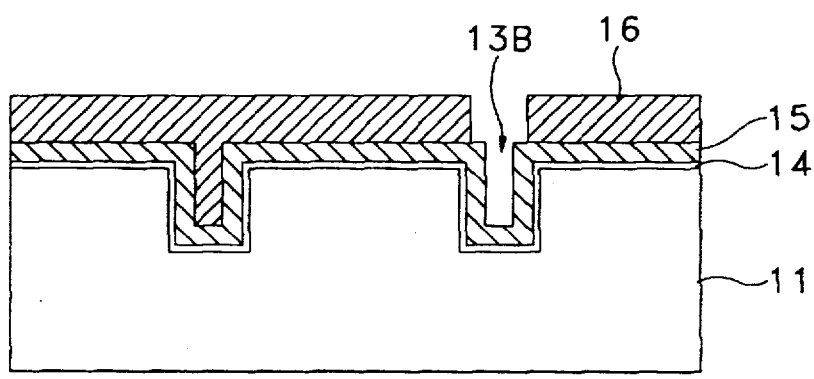
Figure 2C:
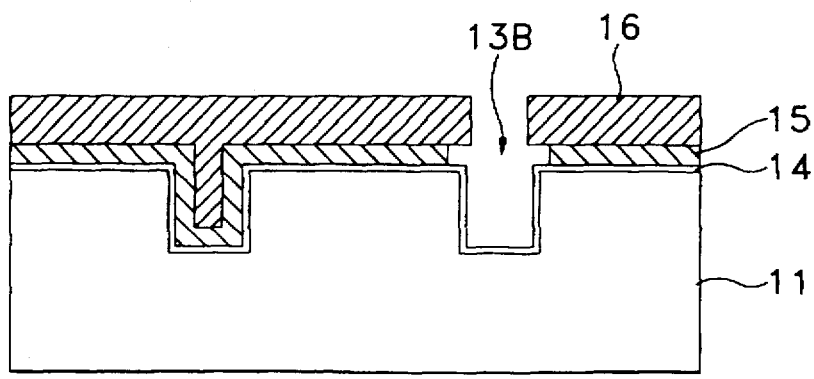

Referring to FIG. 2B, the first resist pattern 12 is removed by conventional method. A pad oxide film 14 having a thickness of 200–400 Angstroms is then formed on semiconductor substrate 11 by thermal oxidation. Subsequently, a silicon nitride film 15 having a thickness of 1000–1200 Angstroms is deposited by a low pressure chemical vapor deposition(LPCVD) technique. A second resist pattern 16 is then formed on silicon nitride film 15 such that the silicon nitride film 15 formed in trench 13B for forming the field oxide layer is exposed. Using the second resist pattern 16, exposed silicon nitride film 15 is etched by phosphine(PH4) solution having a temperature of 160°–175° C. The etching procedure employed is typically an isotropic wet etching procedure, whereby a portion of the silicon nitride film 15 lying underneath the second resist pattern 16 is also etched as shown in FIG. 2C.

Figure 2D:
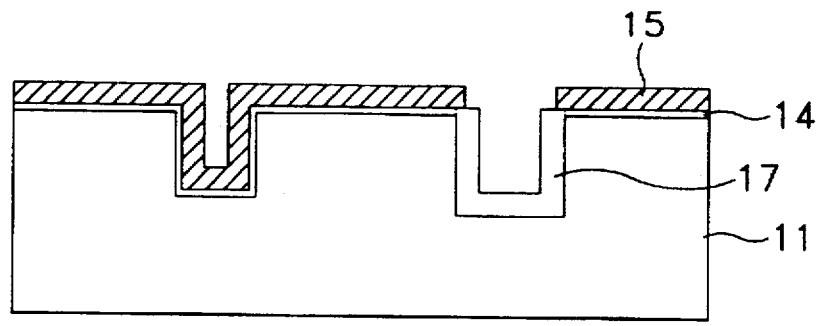

With reference to FIG. 2D, the second resist pattern 16 is removed by conventional method, and inner-wall of the trench 13B is exposed. The inner-wall of the trench is then thermally oxidized to form a field oxide film 17 having a thickness of 4000–7000 Angstroms.

Figure 2E:
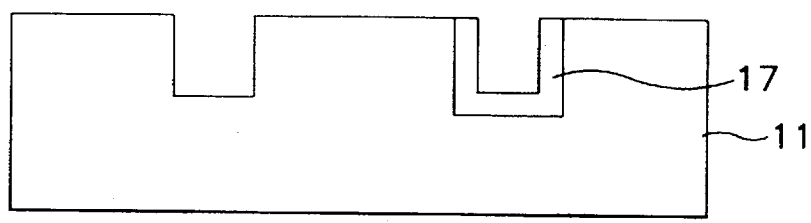
Figure 2F:
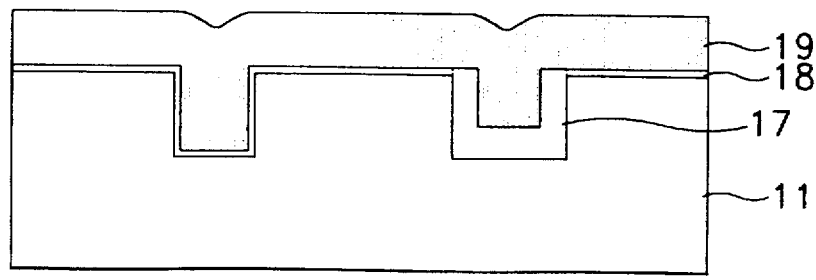

As shown in FIG. 2E, the silicon nitride film 15 is removed by a PH₄ solution, and the pad oxide film 14 is removed by a HF solution. Thereafter, as shown in FIG. 2F, a gate oxide film 18 is formed on surface of the semiconductor substrate 11 including the trenches 13A and 13B where the above-mentioned steps are completed. Subsequently, a doped polysilicon layer 19 having a sufficient thickness of 2000–5000 Angstroms is deposited on the resultant structure formed the gate oxide film 18.

Figure 2G:
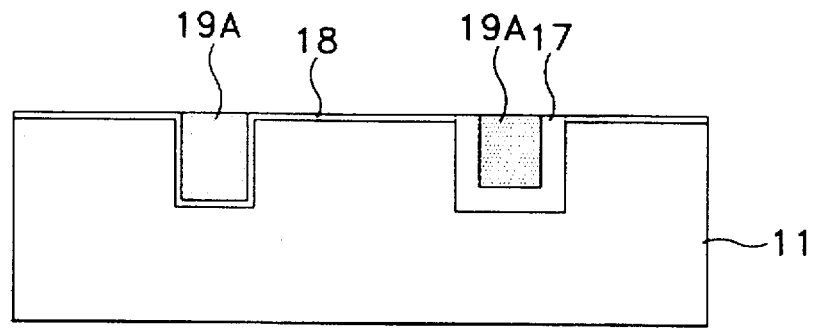

Referring now to FIG. 2G, the doped polysilicon layer 19 is etched by an etchback technique to expose the gate oxide film 18 and surface of the field oxide layer 17. Accordingly, the remaining doped polysilicon layer 19 is filled in trench 13A and 13B, thereby forming a gate 19A. A mixture gas of $Cl_2$ gas, HBr gas and He gas is used in the above etching of the doped polysilicon.

Figure 2H:
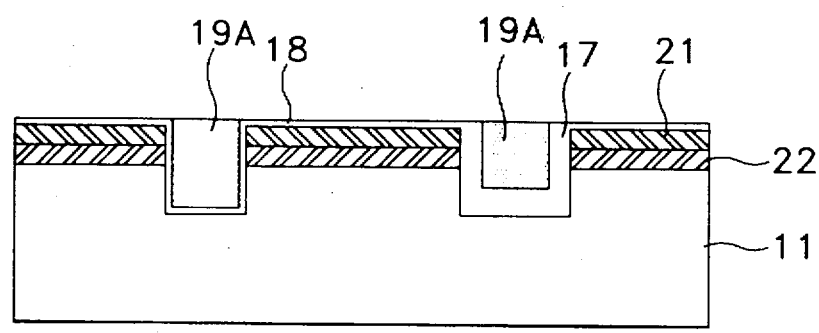

Referring to FIG. 2H, N-type high concentration impurity ions such as arsenic, having a concentration of 1E13–1E17 ions/cm³ and an implantation energy of 30–50 KeV, are implanted into the semiconductor substrate 11 to form a high concentration impurity region 21. Thereafter, N-type low concentration impurity ions such as phosphorous, having a concentration of 1E11–1E15 ions/cm³ and an implantation energy of 40–60 KeV, are implanted in the semiconductor substrate 11 to form a low concentration impurity region 22, wherein the implantation energy for the low concentration impurity region 22 is higher than that for the high concentration impurity region 21. Accordingly, as shown in FIG. 2H, the high concentration impurity region 21 is formed on the low concentration impurity region 22, thereby forming double doped drain(DDD) structure capable of preventing the hot carrier effect. In the above-mentioned embodiment, the high concentration impurity ions were implanted prior to the implantation of the low concentration impurity ions. The low concentration impurity ions, however, may be first implanted to produce the same results.

Figure 3:
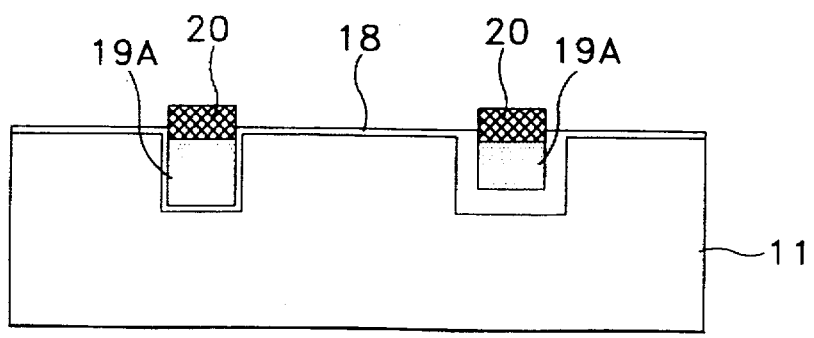
FIG. 3 is a sectional view for explaining the formation of a metal-silicide layer on the gate of FIG. 2F.

FIG. 3 is a sectional view for explaining the formation of a metal-silicide layer on the gate in accordance with another embodiment of the present invention.

In a process of FIG. 3, process steps to the formation step of the gate electrode 19A are identically performed. Afterwards to increase conductivity of the gate electrode 19A, a metal silicide layer 20 such as tungsten silicide is formed on the gate electrode 19A by tungsten deposition method or by tungsten silicide deposition method. The tungsten deposition method requires a thermal annealing step for formation of tungsten silicide, and a removal step of unreacted remaining tungsten metal whereas the tungsten silicide deposition method deposits tungsten silicide in one step. $WF_6$ is used as a source gas for formation of the tungsten silicide layer.

When a metal silicide thickness for fabrication of a memory device is selected to be in the range of 2,000–4,000 Angstroms, a projection height of the formed tungsten-silicide layer from the surface of the semiconductor substrate 11 in the tungsten deposition method is 1,000–2,000 Angstroms. On the other hand, when the tungsten silicide deposition method is used, the projection height is 2,000–4,000 Angstroms, being higher than that of the tungsten deposition method from the surface of the semiconductor substrate 11. The difference due to the fact that tungsten deposited on the semiconductor substrate 11, reacting with the underlying semiconductor substrate 11 when forming the tungsten silicide.

As described previously, the present invention decreases surface topology of a semiconductor device by forming the field oxide and gate electrode inside the silicon substrate and prevents the hot carrier effect by forming a semiconductor device to have DDD structure.

Although the preferred embodiment of the present invention has been disclosed for illustrative purpose, those skilled in the art will appreciate that various modifications, additions and substitutions are possible, without departing from the scope and spirit of the present invention as disclosed in the accompanying claims.

What is claimed is:

1. A method of forming semiconductor device comprises the step of:

forming a plurality of trenches by etching selected regions of a semiconductor substrate;

forming a field oxide layer in the inner wall of trench which is corresponding to selected region of field oxide layer among said trenches;

forming a gate oxide on the semiconductor substrate;

filling said trenches with a conductive material to form a gate electrode; and forming junction region in the semiconductor substrate between said trenches.

2. The method as claimed in claim 1, wherein the step of forming the trench is performed by anisotropically etching the semiconductor substrate such that the etched depth of the trench is 5,000–12,000 Angstroms.

3. The method as claimed in claim 1, wherein said forming step of trenches comprises the steps of:

forming a oxide film on the substrate where the trenches are formed therein;

forming a silicon nitride film on the oxide film;

forming a photoresist pattern on the semiconductor substrate such that the silicon nitride film over the trench which is selected as a field oxide region, is exposed;

removing the exposed silicon nitride film;

forming the field oxide at the region where the silicon nitride film has been removed; and removing the photoresist pattern, silicon nitride film, and oxide film.

4. The method as claimed in claim 3, wherein said exposed silicon nitride film is removed using a PH4 solution of 160°–175° C.

5. The method as claimed in claim 1, wherein said filling step for the formation of said gate electrode gas comprises the steps of:

depositing a polysilicon film to sufficiently fill the trenches; and etching back said polysilicon film until the semiconductor substrate is exposed.

6. The method as claimed in claim 5, wherein said gas for etching polysilicon is comprised of Cl2, HBr, and He gases.

7. The method as claimed in claim 1, further comprising the additional step of forming a metal-silicide layer on the gate, prior to said forming the junction region.

8. The method as claimed in claim 7, wherein said metal-silicide layer is formed by a selective deposition method.

9. The method as claimed in claim 7, wherein said forming step of the metal-silicide layer comprises the steps of:

depositing metal-silicide layer on the whole surface of the silicon substrate; and patterning the deposited metal-silicide layer such that only the region over the gate electrode remains.

10. The method as claimed in claim 1, wherein forming the junction region comprises the step of:

implanting a high concentration impurity ions into the semiconductor substrate adjacent to the gate electrode;

implanting a low concentration impurity ions into the semiconductor substrate where the high concentration impurity ions have been implanted such that the implantation depth of low concentration impurity ions is deeper than that of high concentration impurity ions.

11. The method as claimed in claim 10, wherein said high concentration impurity ions are arsenic, and have a concentration of 1E13–1E17 ion/cm$^3$ and energy of 30–50 KeV.

12. The method as claimed in claim 10, wherein said low concentration impurity ions are P atoms, and have a concentration of 1E11–1E15 ion/cm$^3$ and energy of 40–60 KeV.

13. The method as claimed in claim 1, wherein said forming step of the junction region comprises the step of:

implanting a low concentration impurity ions into the semiconductor substrate;

implanting a high concentration impurity ions into the semiconductor substrate where the low concentration impurity ions have been implanted such that the low concentration impurity ions are deeply implanted than the high concentration impurity ions.

14. The method as claimed in claim 13, wherein said high concentration impurity ions are arsenic, and have a concentration of 1E13–1E17 ion/cm$^3$ and energy of 30–50 KeV.

15. The method as claimed in claim 13, wherein said low concentration impurity ions are phosphorous, and have a concentration of 1E11–1E15 ion/cm$^3$ and energy of 40–60 KeV.

\* \* \* \* \*